(12) United States Patent
Jeong et al.

(10) Patent No.: US 9,048,257 B2
(45) Date of Patent: Jun. 2, 2015

(54) BACKPLANE FOR FLAT PANEL DISPLAY APPARATUS, FLAT PANEL DISPLAY APPARATUS, AND METHOD OF MANUFACTURING THE BACKPLANE

(71) Applicant: Samsung Display Co., Ltd., Yongin, Gyeonggi-do (KR)

(72) Inventors: Jong-Han Jeong, Yongin (KR); Chaun-Gi Choi, Yongin (KR)

(73) Assignee: Samsung Display Co., Ltd. (KR)

( * ) Notice: Subject to any disclaimer, the term of this patent is extended or adjusted under 35 U.S.C. 154(b) by 8 days.

(21) Appl. No.: 14/085,211

(22) Filed: Nov. 20, 2013

(65) Prior Publication Data

US 2014/0080270 A1    Mar. 20, 2014

Related U.S. Application Data

(62) Division of application No. 13/444,736, filed on Apr. 11, 2012, now Pat. No. 8,618,546.

(30) Foreign Application Priority Data

May 20, 2011   (KR) .................. 10-2011-0047944

(51) Int. Cl.
   *H01L 51/56*     (2006.01)
   *H01L 29/66*     (2006.01)
   *H01L 27/12*     (2006.01)

(52) U.S. Cl.
   CPC ...... *H01L 29/66742* (2013.01); *H01L 27/1225* (2013.01); *H01L 27/1255* (2013.01)

(58) Field of Classification Search
   USPC ......... 438/389, 381, 393, 482, 670, 671, 703, 438/149, 587, 48, 57, 98
   See application file for complete search history.

(56) References Cited

U.S. PATENT DOCUMENTS

| 4,528,480 | A | 7/1985 | Unagami et al. |
|---|---|---|---|
| 7,391,151 | B2 | 6/2008 | Koo et al. |
| 8,395,157 | B2 | 3/2013 | Park et al. |
| 2003/0001196 | A1 | 1/2003 | Choi et al. |
| 2003/0211662 | A1* | 11/2003 | Yamazaki et al. ............ 438/142 |
| 2004/0119398 | A1 | 6/2004 | Koo et al. |
| 2005/0140308 | A1 | 6/2005 | Park |
| 2010/0164372 | A1 | 7/2010 | Kai et al. |

(Continued)

FOREIGN PATENT DOCUMENTS

| KR | 10-2008-0058762 | 6/2008 |
|---|---|---|
| KR | 10-2010-0059587 | 6/2010 |
| KR | 10-2010-0088269 | 8/2010 |

*Primary Examiner* — Michael Shingleton
(74) *Attorney, Agent, or Firm* — Knobbe Martens Olson & Bear LLP (57) ABSTRACT

A backplane includes: a substrate, a pixel electrode, which includes a transparent conductive material, on the substrate, a capacitor first electrode formed on the same layer as the pixel electrode, a first protection layer covering the capacitor first electrode and an upper edge of the pixel electrode, a gate electrode of a thin film transistor (TFT) formed on the first protection layer, a capacitor second electrode formed on the same layer as the gate electrode, a first insulating layer that covers the gate electrode and the capacitor second electrode, a semiconductor layer that is formed on the first insulating layer and includes a transparent conductive material, a second insulating layer covering the semiconductor layer, source and drain electrodes of the TFT that are formed on the second insulating layer, and a third insulating layer that covers the source and drain electrodes and exposes the pixel electrode.

8 Claims, 7 Drawing Sheets

(56) References Cited

U.S. PATENT DOCUMENTS

| | | |
|---|---|---|
| 2010/0193790 A1 | 8/2010 | Yeo et al. |
| 2011/0073918 A1 | 3/2011 | Makita |
| 2011/0248377 A1 | 10/2011 | Kakehata |
| 2012/0074397 A1 | 3/2012 | Okumoto |
| 2012/0139000 A1 | 6/2012 | Lee et al. |
| 2012/0206916 A1 | 8/2012 | Ohta |
| 2012/0248453 A1 | 10/2012 | Yamazaki et al. |
| 2012/0292612 A1 | 11/2012 | Jeong et al. |
| 2013/0015456 A1 | 1/2013 | You |
| 2013/0032802 A1 | 2/2013 | Kim et al. |
| 2013/0037817 A1 | 2/2013 | Lee et al. |
| 2013/0134474 A1 | 5/2013 | Takeuchi et al. |
| 2013/0157398 A1 | 6/2013 | Hayakawa et al. |
| 2013/0157399 A1 | 6/2013 | Park et al. |
| 2014/0353609 A1* | 12/2014 | Song ................. 257/40 |
| 2014/0374740 A1* | 12/2014 | Lou et al. ............ 257/43 |
| 2014/0375920 A1* | 12/2014 | Bae et al. ........... 349/42 |

\* cited by examiner

BACKPLANE FOR FLAT PANEL DISPLAY APPARATUS, FLAT PANEL DISPLAY APPARATUS, AND METHOD OF MANUFACTURING THE BACKPLANE

CROSS-REFERENCE TO RELATED APPLICATIONS

This application is a divisional of U.S. application Ser. No. 13/444,736 filed Apr. 11, 2012, which claims the benefit of Korean Patent Application No. 10-2011-0047944, filed on May 20, 2011, in the Korean Intellectual Property Office, the disclosures of which are incorporated by reference herein in their entirety.

BACKGROUND

1. Field

The present disclosure relates to a backplane for a flat panel display apparatus, a flat panel display apparatus including the same, and a method of manufacturing the backplane for the flat panel display apparatus.

2. Description of the Related Technology

Flat panel display apparatuses, including organic light emitting display apparatuses and liquid crystal display apparatuses, are formed on active type backplanes that include thin film transistors (TFTs) and capacitors formed in each pixel to realize high resolution displays.

Oxide semiconductor TFTs are evaluated as optimum devices that can be applied to backplanes for flat panel display apparatuses since they have high performance characteristics and can be processed at a low temperature. However, a process for manufacturing backplanes for flat panel display apparatuses that include oxide semiconductors TFT generally includes a plurality of mask processes, thereby increasing manufacturing costs.

SUMMARY OF CERTAIN INVENTIVE ASPECTS

To address the above and/or other problems, the present disclosure provides a backplane that may be manufactured in a simple process and has a high quality display for a flat panel display apparatus, a flat panel display apparatus including the backplane, and a method of manufacturing the backplane.

According to one aspect, there is provided a backplane for a flat panel display apparatus, the backplane including: a substrate, a pixel electrode that comprises a transparent conductive material on the substrate, a capacitor first electrode formed on the same layer as the pixel electrode, a first protection layer covering the capacitor first electrode and an upper edge of the pixel electrode and, a gate electrode of a thin film transistor (TFT) formed on the first protection layer and a capacitor second electrode formed on the same layer as the gate electrode and using the same material used to form the gate electrode, a first insulating layer that covers the gate electrode and the capacitor second electrode, a semiconductor layer that is formed on the first insulating layer and comprises a transparent conductive material, a second insulating layer covering the semiconductor layer, source and drain electrodes of the TFT formed on the second insulating layer, where the source and drain electrodes are connected to the semiconductor layer through the second insulating layer, and at least one of the source and drain electrodes is connected to the pixel electrode; and a third insulating layer that covers the source and drain electrodes and exposes the pixel electrode.

The capacitor first electrode may be formed of the same material used to form the pixel electrode.

The transparent conductive material may be at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The pixel electrode may further include a semi-transparent metal layer.

The semi-transparent metal layer may include silver Ag.

The first protection layer may be an insulating layer.

The capacitor second electrode may be formed of the same material used to form the gate electrode.

The semiconductor layer may include at least one metal selected from the group consisting of gallium Ga, indium In, zinc Zn, hafnium Hf, and tin Sn and oxygen $O_2$.

One of the source and drain electrodes may be connected to the pixel electrode through a via hole that simultaneously penetrates through the first protection layer, the first insulating layer, and the second insulating layer.

The first protection layer, the first insulating layer, and the second insulating layer may form an opening that exposes an upper surface of the pixel electrode, an etch surface formed by the first protection layer and etch surfaces formed by the first insulating layer and the second insulating layer may form a gap.

The backplane may further include a second protection layer formed of the same material used to form the gate electrode between the first protection layer and the first insulating layer, wherein etch surfaces of each of the second protection layer, the first insulating layer, and the second insulating layer that form an opening are on the same plane.

The first protection layer, the first insulating layer, and the second insulating layer may form an opening that exposes an upper surface of the pixel electrode, and etch surfaces of each of the first protection layer, the first protection layer, the first insulating layer, and the second insulating layer that form an opening are on the same plane.

The backplane may further include a second protection layer formed of the same material used to form the gate electrode between the first protection layer and the first insulating layer, wherein etch surfaces of each of the first protection layer, the second protection layer, the first insulating layer, and the second insulating layer that form an opening are on the same plane.

The backplane may further include a capacitor third electrode on the second insulating layer.

According to another aspect, there is provided a flat panel display apparatus including: the backplane described above, a facing electrode that faces the pixel electrode, and a light emitting unit formed between the pixel electrode and the facing electrode.

The facing electrode may be a reflection electrode that reflects light emitted from the light emitting unit.

The light emitting unit may include an organic light emitting layer.

According to another aspect, there is provided a method of manufacturing a backplane for a flat panel display apparatus, the method including: forming a pixel electrode and a capacitor first electrode on a substrate through a first mask process; forming a first protection layer covering the pixel electrode and the capacitor first electrode, and forming a gate electrode of a TFT and a capacitor second electrode on the first protection layer through a second mask process; forming a first insulating layer covering the gate electrode and the capacitor second electrode, and forming a semiconductor layer that includes a transparent conductive material on a position corresponding to the gate electrode through a third mask process; forming a second insulating layer covering the semiconductor layer, forming a contact hole that penetrates the second insulating layer and exposes a portion of the semiconductor layer, and forming a via hole that penetrates the first protection layer, the first insulating layer, and the second insulating layer and exposes a portion of the pixel electrode through a fourth mask process; forming source and drain electrodes covering the contact hole and the via hole through a fifth mask process; and forming a third insulating layer covering the source and drain electrodes, and forming an opening that exposes an upper surface of the pixel electrode in the third insulating layer through a sixth mask process.

The pixel electrode and the capacitor first electrode may be formed of the same material on the same layer.

The gate electrode of the TFT and the capacitor second electrode may be formed of the same material on the same layer.

The second mask process may further include forming a second protection layer having an area smaller than that of the pixel electrode on the first protection layer.

The second protection layer may be formed of the same material used to form the gate electrode and the capacitor second electrode.

The fourth mask process may include forming an opening that exposes the second protection layer by removing the first insulating layer and the second insulating layer, and where the fifth mask process may include removing the second protection layer, and the sixth mask process may include removing the first protection layer.

The fourth mask process may include forming an opening that exposes the second protection layer by removing the first insulating layer and the second insulating layer, and where the fifth mask process may include simultaneously removing the first insulating layer and the second insulating layer.

The fifth mask process may include forming a capacitor third electrode on the same layer as the source and drain electrodes.

In a backplane according to embodiments of the present invention, a flat panel display apparatus having the backplane, and a method of manufacturing the backplane, the number of masks used is reduced, and accordingly, manufacturing process can be simplified.

Since a first protection layer is formed on a pixel electrode, damage to the pixel electrode during a manufacturing process can be prevented.

A capacitance can be increased without increasing an area of capacitors by forming the capacitors in parallel.

BRIEF DESCRIPTION OF THE DRAWINGS

The above and other features and advantages will become more apparent by describing in certain embodiments with reference to the attached drawings in which.

DETAILED DESCRIPTION OF CERTAIN INVENTIVE EMBODIMENTS

Certain embodiments of the present invention will now be described more fully with reference to the accompanying drawings. In the drawings, the thicknesses of layers and regions may be exaggerated for clarity, and like reference numerals generally refer to like elements.

Figure 1:
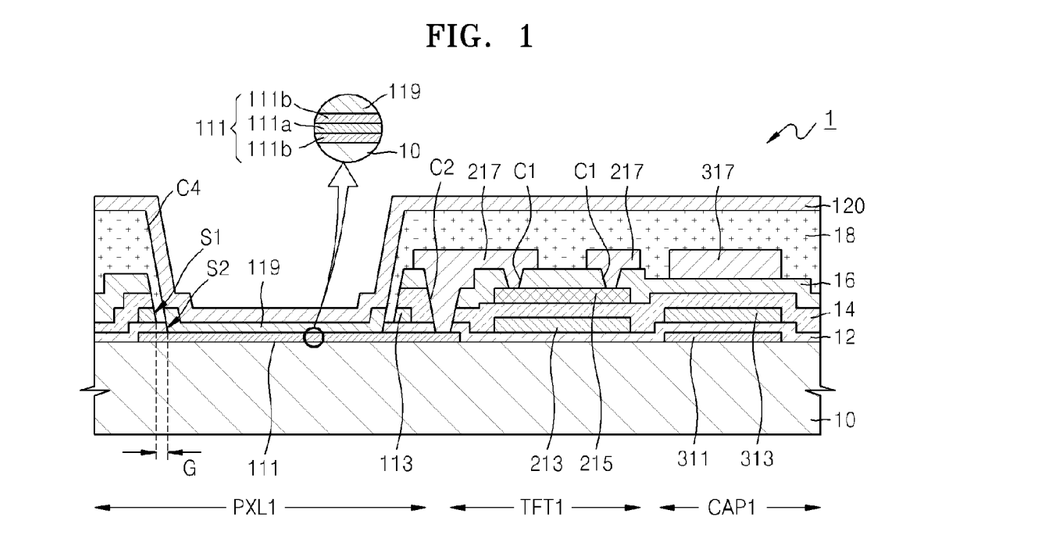
FIG. 1 is a schematic cross-sectional view of an embodiment of an organic light emitting display apparatus.

FIG. 1 is a schematic cross-sectional view of an embodiment of an organic light emitting display apparatus 1. FIGS. 2A through 2F are schematic cross-sectional views showing an embodiment of a method of manufacturing the organic light emitting display apparatus 1 of FIG. 1.

Referring to FIG. 1, in the organic light emitting display apparatus 1, a pixel region PXL1 having a light emitting layer 119, a thin film transistor (TFT) region TFT1 having a TFT, and a capacitor region CAP1 having a capacitor are formed on a substrate 10.

In the TFT region TFT1, the substrate 10 and a first protection layer 12 are formed. In some embodiments, the substrate 10 may be formed of a transparent material, and the first protection layer 12 may be formed of an insulating film.

A gate electrode 213 of the TFT is formed on the first protection layer 12. A first insulating layer 14 that functions as a gate insulating film is formed on the gate electrode 213, and a semiconductor layer 215 is formed on the first insulating layer 14.

In some embodiments, the semiconductor layer 215 includes a transparent conductive oxide. The transparent oxide may include at least one of gallium (Ga), indium (In), zinc (Zn), hafnium (Hf), and tin (Sn). In various embodiments, the transparent conductive oxide may be one of InGaZnO, ZnSnO, InZnO, InGaO, ZnO, TiO, and hafnium-indium-zinc oxide (HIZO). An oxide semiconductor TFT that includes a transparent conductive oxide, as an active layer, has high performance characteristics and can be manufactured using a low temperature process, and thus, is evaluated as an optimum device for a backplane for a flat panel display apparatus. The oxide semiconductor TFT has a transparent characteristic in a visible light region and is flexible. Therefore, the oxide semiconductor TFT may be applied to a transparent display apparatus or a flexible display apparatus.

A second insulating layer 16 covering the semiconductor layer 215 is formed. Source and drain electrodes 217 connected to the semiconductor layer 215 through contact holes C1 that penetrate through the second insulating layer 16 are formed on the second insulating layer 16. One of the source and drain electrodes 217 is connected to an upper edge of a pixel electrode 111 of the pixel region PXL1 via a via hole C2 that simultaneously penetrates the first protection layer 12, the first insulating layer 14, and the second insulating layer 16.

The pixel electrode 111 that includes a transparent conductive material is formed on the substrate 10 in the pixel region PXL1. The pixel electrode 111 may include at least one of indium tin oxide (ITO), indium zink oxide (IZO), zinc oxide (ZnO), indium oxide (In2O3), indium gallium oxide (IGO), and aluminum zinc oxide (AZO).

The pixel electrode 111 may be formed as a multiple layer that includes a semi-transparent metal layer 111a that includes silver (Ag). As depicted in FIG. 1, the pixel electrode 111 may further include the semi-transparent metal layer 111a that includes silver (Ag) and a layer 111b that includes a transparent conductive material such as ITO on the semi-transparent metal layer 111a. The semi-transparent metal layer 111a functions as a semi-transparent mirror and may form a resonance structure together with a facing electrode 120 that functions as a reflection mirror, and thus, can increase optical extraction efficiency of the display apparatus.

The first protection layer 12 is formed on an upper edge of the pixel electrode 111. The first protection layer 12 may function as a protective film for preventing the pixel electrode 111 from degrading during a manufacturing process of the pixel electrode 111, and may function as a dielectric film of the capacitor. The first protection layer 12 may be one of various insulating films formed of a material selected from SiNx, SiOx, and SiON.

A second protection layer 113 is formed on an upper edge of the pixel electrode 111 by using the same material used to form the gate electrode 213. The first insulating layer 14 and the second insulating layer 16 are sequentially stacked on the second protection layer 113. The second protection layer 113, the first insulating layer 14, and the second insulating layer 16 form an opening for exposing the pixel electrode 111. Etching surfaces Si of the opening in the second protection layer 113, the first insulating layer 14, and the second insulating layer 16 form the same plane. The second protection layer 113 may function as a protective film for preventing the pixel electrode 111 from degrading during the manufacturing process of the pixel electrode 111.

A third insulating layer 18 is formed on the second insulating layer 16, and an opening C4 that exposes the pixel electrode 111 is formed in the third insulating layer 18. Etching surfaces S2 of the third insulating layer 18 and the first protection layer 12 form the same plane. Accordingly, the etching surfaces S2 of the first protection layer 12 and the second protection layer 113 that expose the pixel electrode 111 may form a gap G.

The light emitting layer 119 is formed on the pixel electrode 111, and light generated from the light emitting layer 119 is emitted towards the substrate 10 through the pixel electrode 111 formed of a transparent conductive material.

The light emitting layer 119 may be formed of a low molecular organic material or a polymer organic material. If the light emitting layer 119 is formed of a low molecular organic material, a hole transport layer (HTL), a hole injection Layer (HIL), an electron transport layer (ETL), and an electron injection layer (EIL) may be stacked around the light emitting layer 119. Also, various layers may be stacked as necessary. The low molecular organic material may include copper phthalocyanine (CuPc), N,N'-di(naphthalene-1-yl)-N,N'-diphenyl-benzidine (NPB), or tris-8-hydroxyquinoline aluminum (Alq3). In embodiments where the light emitting layer 119 is formed of a polymer organic material, a hole transport layer HTL may be included in addition to the light emitting layer 119. The HTL may be formed of poly-(2,4)-ethylene-dihydroxy thiophene (PEDOT) or polyaniline (PANT). The organic material may be a poly organic material such as poly-phenylenevinylene (PPV), and polyfluorene.

The facing electrode 120 as a common electrode is formed on the light emitting layer 119. In some embodiments, the pixel electrode 111 is used as an anode, and the facing electrode 120 is used as a cathode. The polarities of the pixel electrode 111 and the facing electrode 120 may be reversed in other embodiments.

The facing electrode 120 may be formed as a reflective electrode that includes a reflective material. The facing electrode 120 may include at least one of Al, Mg, Li, Ca, LiF/Ca, and LiF/Al. Since the facing electrode 120 is a reflective electrode, light generated from the light emitting layer 119 is reflected by the facing electrode 120 and is emitted towards the substrate 10 through the pixel electrode 111 formed of a transparent conductive material. If the pixel electrode 111 further includes the semi-transparent metal layer 111a that includes silver Ag, the semi-transparent metal layer 111a may function as a semi-transparent mirror, may form a resonance structure together with the facing electrode 120 that functions as a reflection mirror, thereby increasing optical extraction efficiency of the organic light emitting display apparatus 1.

In the capacitor region CAP 1, a capacitor first electrode 311 and a capacitor second electrode 313 are disposed on the substrate 10 with the first protection layer 12 interposed therebetween.

The capacitor first electrode 311 is formed on the same layer as the pixel electrode 111 using the same material used to form the pixel electrode 111. The capacitor second electrode 313 is formed on the same layer as the gate electrode 213 using the same material used to form the gate electrode 213. The first protection layer 12 functions as a dielectric film. In some embodiments, since the capacitor first electrode 311 and the capacitor second electrode 313 are respectively formed in the same mask process for forming the pixel electrode 111 and the gate electrode 213, the manufacturing process may be simplified.

The first insulating layer 14 and the second insulating layer 16 are sequentially stacked on the capacitor second electrode 313, and a capacitor third electrode 317 that is formed on the same layer as the source and drain electrodes 217. The capacitor 317 may be formed of the same material used to form the source and drain electrodes 217, and may be formed on the second insulating layer 16. Since the capacitor first electrode 311 and the capacitor second electrode 313 form a metal-insulator-metal (MIM) cap, when the area of the capacitor is increased to increase a capacitance, an opening ratio of a display apparatus may be reduced. However, when the capacitor third electrode 317 is additionally formed, the capacitance is increased since the capacitor third electrode 317 is connected in parallel to the capacitor first electrode 311 and the capacitor second electrode 313. Therefore, even though the area of the capacitor is reduced, the reduced capacitance can be compensated for.

The third insulating layer 18, which covers the source and drain electrodes 217 and the capacitor third electrode 317, is formed and the opening C4 that exposes the pixel electrode 111 is formed in the third insulating layer 18.

Hereinafter, an embodiment of a method of manufacturing the organic light emitting display apparatus 1 will be described with reference to FIGS. 2A through 2F.

FIGS. 2A through 2F are schematic cross-sectional views showing an embodiment of a method of manufacturing the organic light emitting display apparatus 1 of FIG. 1.

Figure 2A:
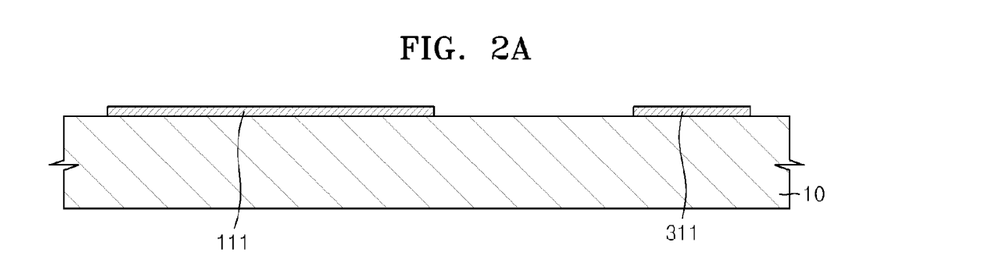
FIGS. 2A through 2F are schematic cross-sectional views showing an embodiment of a method of manufacturing the organic light emitting display apparatus of FIG. 1.

Referring to FIG. 2A, the pixel electrode 111 and the capacitor first electrode 311 are simultaneously formed on the substrate 10 in a first mask process. A buffer layer (not shown) that includes $SiO_2$ and/or SiNx may further be formed on the substrate 10 to provide planarity to the substrate 10 and to block penetration of foreign elements into the substrate 10.

Although the manufacturing process is not shown in detail in FIG. 2A, FIG. 2A shows a result whereby, after depositing a transparent conductive material on the substrate and coating a photoresist (not shown) on the transparent conductive material, the pixel electrode 111 and the capacitor first electrode 311 are simultaneously patterned by a photolithography process using a first mask (not shown). The first mask process using photolithography includes a series of processes such as developing, etching, and stripping or ashing after exposing the first mask (not shown) using an exposure apparatus (not shown). Hereinafter, the same mask processes using photolithography will not be repeatedly described.

Figure 2B:
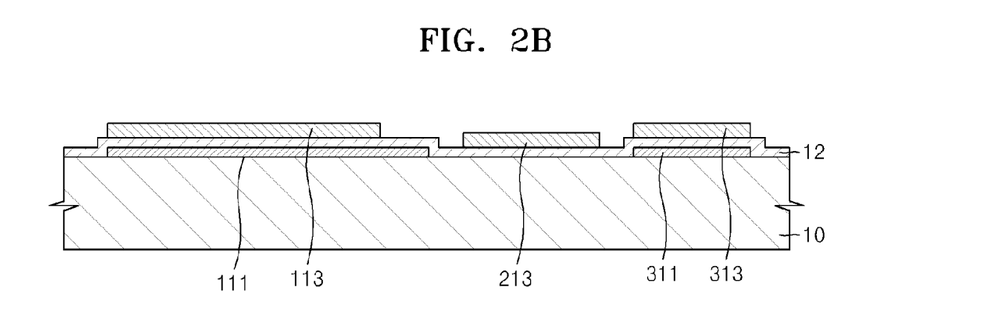

FIG. 2B is a cross-sectional view of a result of a second mask process of the embodiment of an organic light emitting display apparatus 1.

The first protection layer 12 is formed on the resultant product of the first mask process, and the second protection layer 113, the gate electrode 213, and the capacitor second electrode 313 are simultaneously formed on the first protection layer 12. The second protection layer 113 is not formed in a region where the via hole C2 contacts the pixel electrode 111. Accordingly, the second protection layer 113 has an area smaller than that of the pixel electrode 111.

Figure 2C:
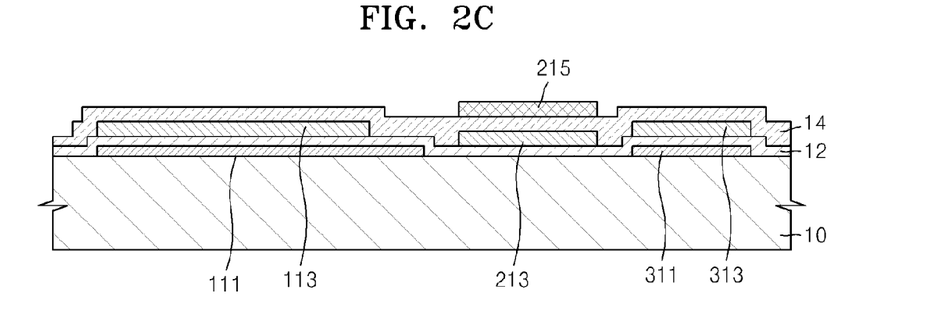

FIG. 2C is a cross-sectional view of a resultant product of a third mask process of the embodiment of an organic light emitting display apparatus 1.

The first insulating layer 14 is formed on the resultant product of the second mask process, and the semiconductor layer 215 is formed on the first insulating layer 14. The semiconductor layer 215 may include a transparent conductive oxide.

Figure 2D:
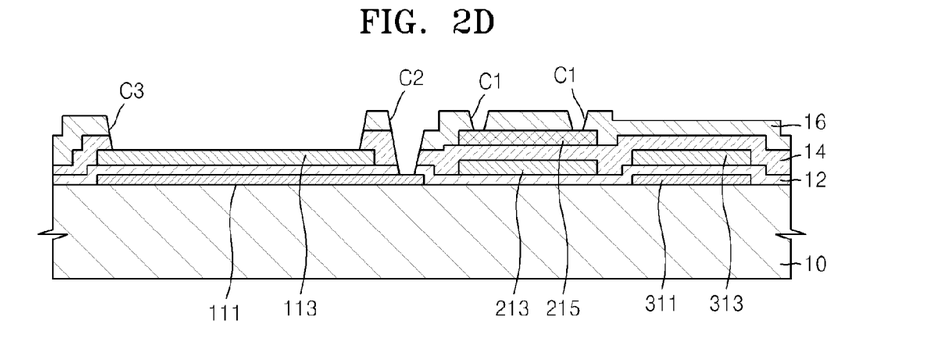

FIG. 2D is a cross-sectional view of a resultant product of a fourth mask process of the embodiment of an organic light emitting display apparatus 1.

The second insulating layer 16 is formed on the resultant product of the third mask process, and the contact hole C1 and the via hole C2 are formed. In a region corresponding to the upper side of the pixel electrode 111, an opening C3 that exposes an upper surface of the second protection layer 113 is formed by removing the first insulating layer 14 and the second insulating layer 16. Since the second protection layer 113 is not removed but remains above the pixel electrode 111, the second protection layer 113 protects the first protection layer 12 and the pixel electrode 111 when the contact hole C1, the via hole C2, and the opening C3 are formed.

Figure 2E:
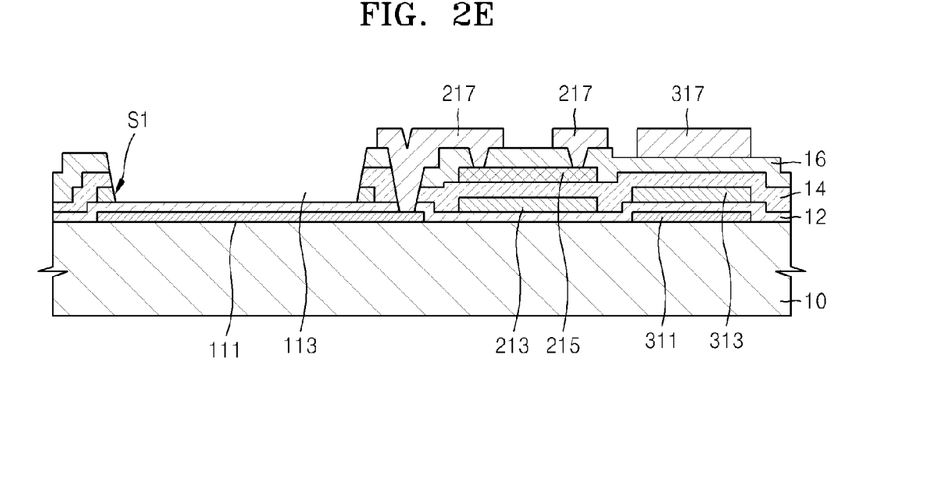

FIG. 2E is a cross-sectional view of a resultant product of a fifth mask process of the embodiment of an organic light emitting display apparatus 1.

After depositing a metal material for forming the source and drain electrodes 217 covering the contact hole C1, the via hole C2, and the opening C3, the source and drain electrodes 217 and the capacitor third electrode 317 are formed by patterning the metal material.

The metal material for forming the source and drain electrodes 217 is also deposited on the opening C3 that is formed in the fourth mask process. The metal material is removed together with the second protection layer 113. At this point, if the material for forming the second protection layer 113 is the same material used to form the source and drain electrodes 217, the second protection layer 113 and the metal material are removed by a single etching process. If the second protection layer 113 is formed of a material different from that used to form the source and drain electrodes 217, multiple etching processes may be performed.

In some embodiments, while the material used to form the source and drain electrodes 217 is removed from the opening C3 formed on the pixel electrode 111, the first protection layer 12 protects the pixel electrode 111.

Figure 2F:
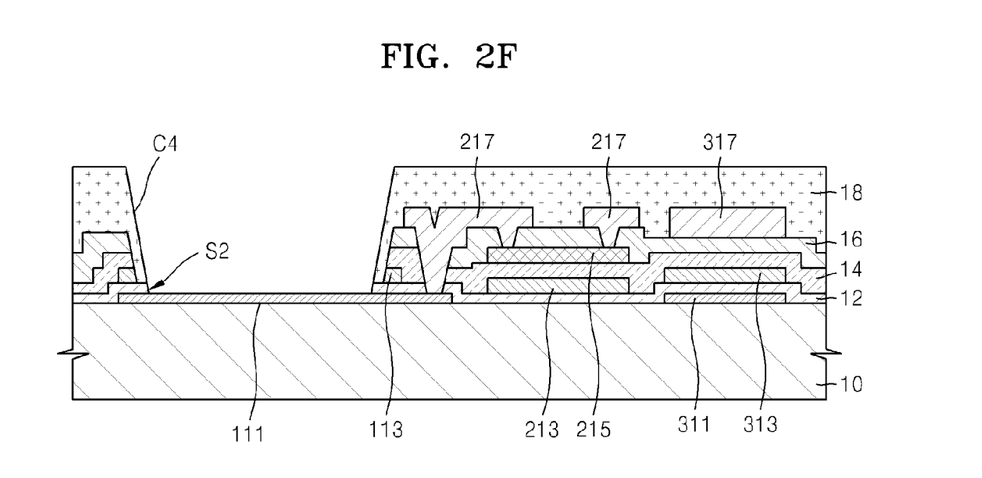

FIG. 2F is a cross-sectional view of a resultant product of a sixth mask process of the embodiment of an organic light emitting display apparatus 1.

The third insulating layer 18 is formed on the resultant product of the fifth mask process, and the opening C4 that exposes an upper surface of the pixel electrode 111 is formed by removing a portion of the third insulating layer 18. The first protection layer 12 formed on the pixel electrode 111 is also removed. Accordingly, the third insulating layer 18 and the first protection layer 12 may form the same etching surface S2.

Another embodiment of an organic light emitting display apparatus 2 will now be described with reference to FIG. 3.

Figure 3:
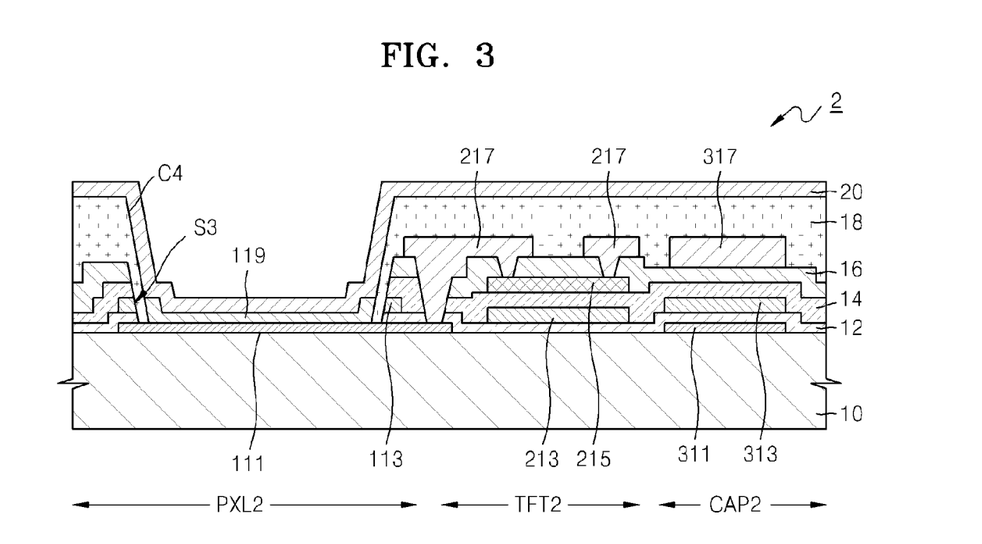
FIG. 3 is a schematic cross-sectional view of another embodiment of an organic light emitting display apparatus.
Figure 4A:
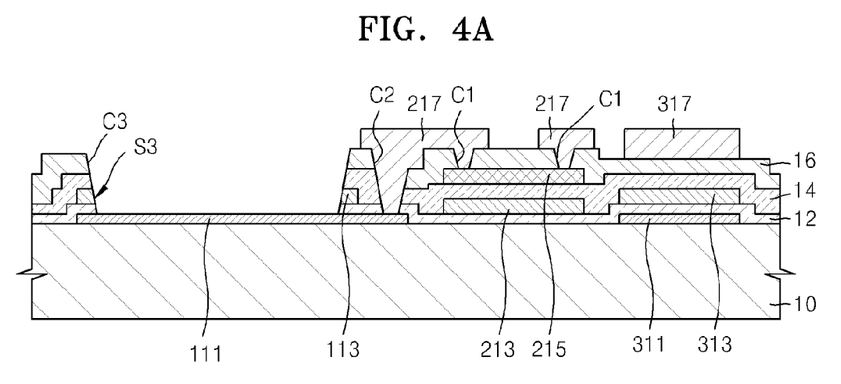
FIGS. 4A and 4B are schematic cross-sectional views showing another embodiment of a method of manufacturing the organic light emitting display apparatus of FIG. 3.
Figure 4B:
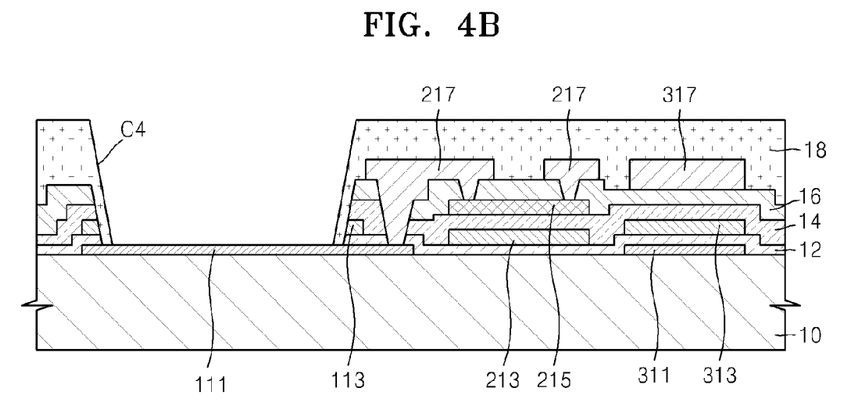

FIG. 3 is a schematic cross-sectional view of another embodiment of an organic light emitting display apparatus 2. FIGS. 4A and 4B are schematic cross-sectional views showing an embodiment of a method of manufacturing the organic light emitting display apparatus 2 of FIG. 3. Hereinafter, mainly the differences from the organic light emitting display apparatus 1 will be described.

FIGS. 4A and 4B are schematic cross-sectional views respectively showing the fifth and sixth mask processes of the organic light emitting display apparatus 2. The first through fourth mask processes of the organic light emitting display apparatus 2 are performed the same as described with reference to the organic light emitting display apparatus 1 of FIG. 1.

Referring to FIG. 4A, after depositing a metal material for forming the source and drain electrodes 217 covering the contact hole C1, the via hole C2, and the opening C3, which are formed in the fourth mask process, the source and drain electrodes 217 and the capacitor third electrode 317 are formed by patterning the metal material.

The metal material for forming the source and drain electrodes 217 is also deposited in the opening C3 in the fourth mask process. The metal material in the opening C3 is removed together with the second protection layer 113 and the first protection layer 12. Accordingly, since the second protection layer 113 and the first protection layer 12 are etched in the same mask process, the second protection layer 113 and the first protection layer 12 have the same etching surface S3.

Referring to FIG. 4B, the third insulating layer 18 is formed on the resultant product of the fifth mask process, and the opening C4 that exposes the upper surface of the pixel electrode 111 is formed by removing a portion of the third insulating layer 18.

Accordingly, in the organic light emitting display apparatus 2, since the first protection layer 12 is removed together with the second protection layer 113 in the fifth mask process, the first protection layer 12 and the second protection layer 113 have the same etching surface S3.

Figure 5:
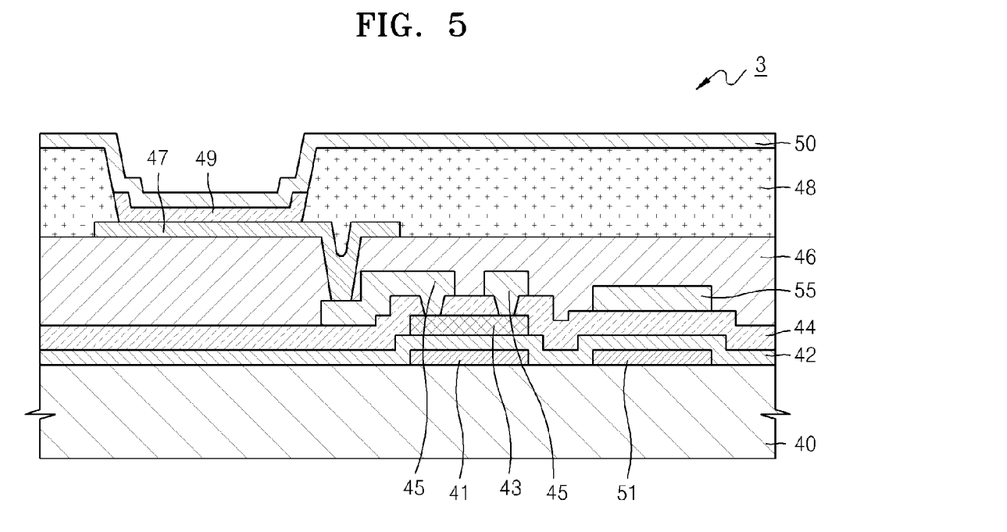
FIG. 5 is a schematic cross-sectional view of an organic light emitting display apparatus according to a comparative example.

Hereinafter, a comparative example will be described with reference to FIGS. 5 and 6A through 6G. FIG. 5 is a schematic cross-sectional view of an organic light emitting display apparatus 3 according to a comparative example. FIGS. 6A through 6G are schematic cross-sectional views showing a method of manufacturing the comparative example of an organic light emitting display apparatus 3 of FIG. 5.

Figure 6A:
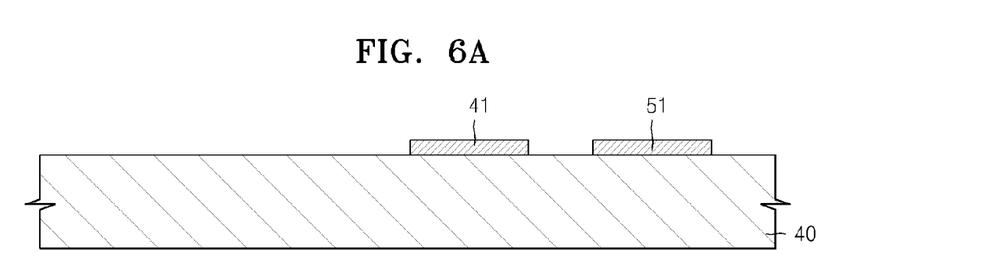
FIGS. 6A through 6G are schematic cross-sectional views showing a method of manufacturing the organic light emitting display apparatus of FIG. 5, according to the comparative example.

FIG. 6A is a schematic cross-sectional view of a result of a first mask process of the organic light emitting display apparatus 3. Referring to FIG. 6A, a gate electrode 41 and a capacitor first electrode 51 of a TFT are simultaneously formed on a substrate 40 in the first mask process.

Figure 6B:
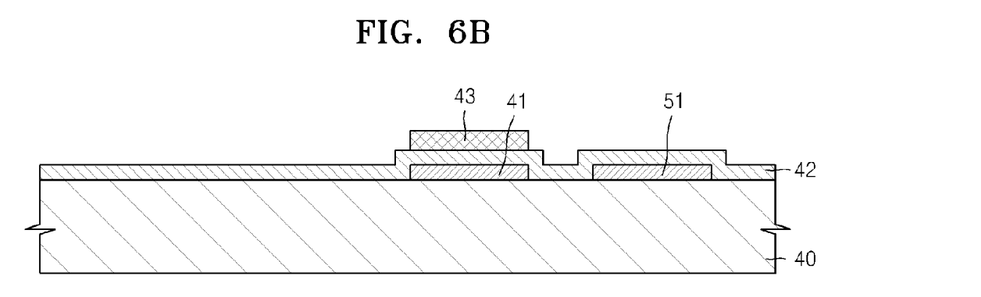

FIG. 6B is a schematic cross-sectional view of a result of a second mask process of the organic light emitting display apparatus 3. Referring to FIG. 6B, a first insulating layer 42 is formed on the resultant product of the first mask process, and a semiconductor layer 43 that includes a transparent conductive oxide is formed on the first insulating layer 42.

Figure 6C:
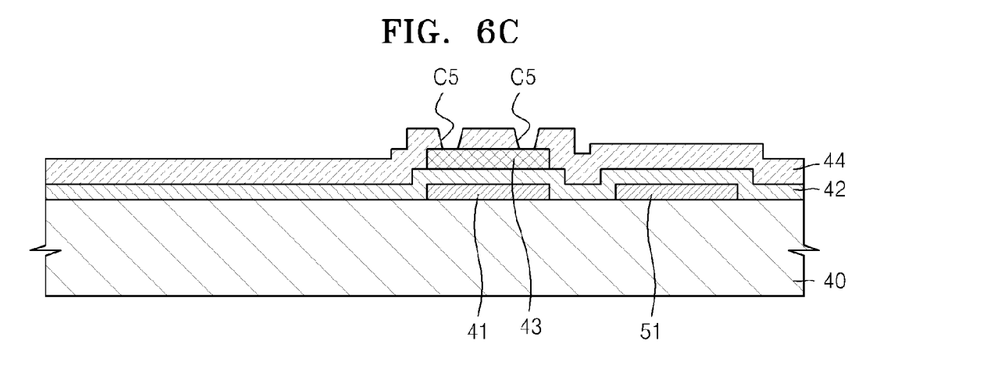

FIG. 6C is a schematic cross-sectional view of a result of a third mask process of the organic light emitting display apparatus 3. Referring to FIG. 6C, a second insulating layer 44 is formed on the resultant product of the second mask process, and contact holes C5 that expose portions of the semiconductor layer 43 are formed.

Figure 6D:
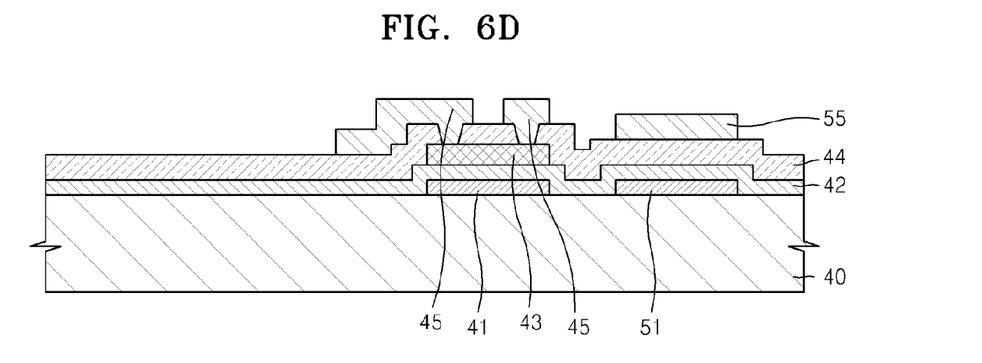

FIG. 6D is a schematic cross-sectional view of a result of a fourth mask process of the organic light emitting display apparatus 3. Referring to FIG. 6D, after depositing a material for forming source and drain electrodes 45 covering the contact holes C5, the source and drain electrodes 45 are formed by patterning the material. A capacitor third electrode 55 is also simultaneously formed.

Figure 6E:
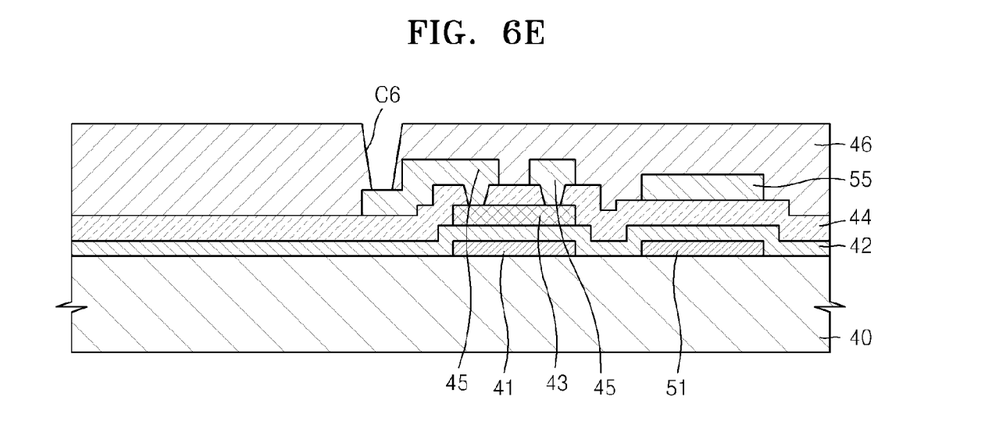

FIG. 6E is a schematic cross-sectional view of a result of a fifth mask process of the organic light emitting display apparatus 3. Referring to FIG. 6E, a third insulating layer 46 is formed on the resultant product of the fourth mask process, and a via hole C6 that exposes one of the source and drain electrodes 45 is formed.

Figure 6F:
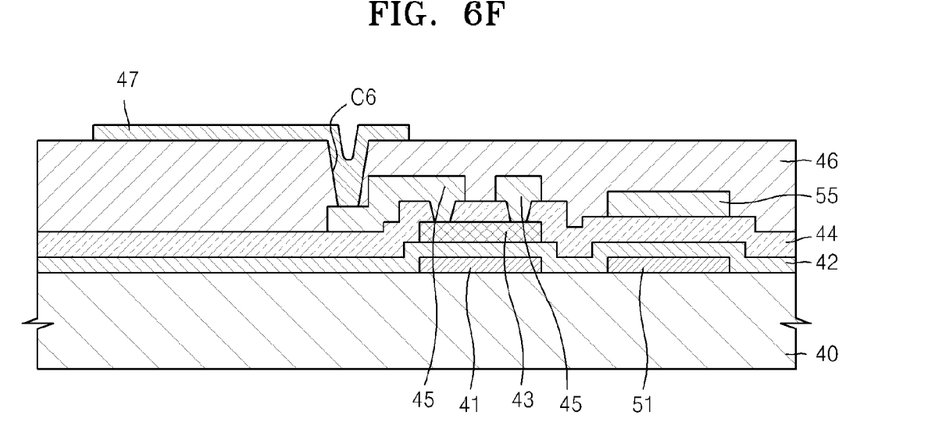

FIG. 6F is a schematic cross-sectional view of a result of a sixth mask process of the organic light emitting display apparatus 3. Referring to FIG. 6F, after depositing a material for forming a pixel electrode 47 covering the via hole C6 formed in the fifth mask process, the pixel electrode 47 is formed by patterning the material.

Figure 6G:
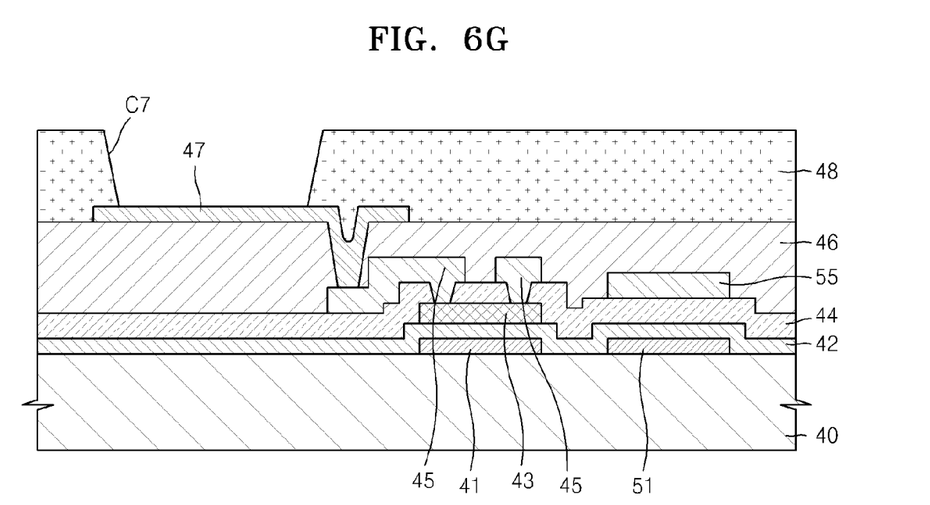

FIG. 6G is a schematic cross-sectional view of a result of a seventh mask process of the organic light emitting display apparatus 3. Referring to FIG. 6G, a fourth insulating layer 48 is formed on the resultant product of the sixth mask process, and an opening C7 that exposes an upper surface of the pixel electrode 47 is formed by removing a portion of the fourth insulating layer 48.

Referring to FIG. 5, a light emitting layer 49 and a facing electrode 50 are formed in the opening C7 formed in the seventh mask process.

In the comparative example of the organic light emitting display apparatus 3, in order to manufacture a backplane that includes a bottom gate type oxide semiconductor, mask processes are performed a total of seven times. However, in the embodiments of organic light emitting display apparatuses 1 and 2, in order to manufacture a backplane that includes a bottom gate type oxide semiconductor, mask processes are performed a total of five times, including the fifth mask process for forming the pixel electrode 111, or a total of six times, including the sixth mask process for forming the opening C4 that exposes the pixel electrode 111 by patterning the third insulating layer 18. Accordingly, as a result of the reduction of mask processes, manufacturing costs may be greatly reduced.

Embodiments of the present invention are described with reference to an organic light emitting display apparatus, but the present invention is not limited thereto. The present invention may also be applied to a liquid crystal display apparatus in which a light emitting layer includes liquid crystals. The present invention may also be applied to various kinds of display apparatuses.

While the present invention has been particularly shown and described with reference to certain embodiments thereof, it will be understood by those of ordinary skill in the art that various changes in form and details may be made therein without departing from the spirit and scope of the present invention as defined by the following claims.

What is claimed is:

1. A method of manufacturing a backplane for a flat panel display apparatus, the method comprising:
    forming a pixel electrode and a capacitor first electrode on a substrate through a first mask process;
    forming a first protection layer covering the pixel electrode and the capacitor first electrode, and forming a gate electrode of a TFT and a capacitor second electrode on the first protection layer through a second mask process;
    forming a first insulating layer covering the gate electrode and the capacitor second electrode, and forming a semiconductor layer that comprises a transparent conductive material on a position corresponding to the gate electrode through a third mask process;
    forming a second insulating layer covering the semiconductor layer, forming a contact hole that penetrates the second insulating layer and exposes a portion of the semiconductor layer, and forming a via hole that penetrates the first protection layer, the first insulating layer, and the second insulating layer and exposes a portion of the pixel electrode through a fourth mask process;
    forming source and drain electrodes covering the contact hole and the via hole through a fifth mask process; and
    forming a third insulating layer covering the source and drain electrodes, and forming an opening that exposes an upper surface of the pixel electrode in the third insulating layer through a sixth mask process.

2. The method of claim 1, wherein the pixel electrode and the capacitor first electrode are formed of the same material on the same layer.

3. The method of claim 1, wherein the gate electrode of the TFT and the capacitor second electrode are formed of the same material on the same layer.

4. The method of claim 1, wherein the second mask process comprises forming a second protection layer having an area smaller than that of the pixel electrode on the first protection layer.

5. The method of claim 4, wherein the second protection layer is formed of the same material used to form the gate electrode and the capacitor second electrode.

6. The method of claim 4, wherein the fourth mask process comprises forming an opening that exposes the second protection layer by removing the first insulating layer and the second insulating layer, and wherein the fifth mask process comprises removing the second protection layer, and the sixth mask process comprises removing the first protection layer.

7. The method of claim 4, wherein the fourth mask process comprises forming an opening that exposes the second protection layer by removing the first insulating layer and the second insulating layer, and wherein the fifth mask process comprises simultaneously removing the first insulating layer and the second insulating layer.

8. The method of claim 1, wherein the fifth mask process comprises forming a capacitor third electrode on the same layer as the source and drain electrodes.

* * * * *